(12) United States Patent
Nakagawa et al.

(10) Patent No.: US 6,359,930 B1
(45) Date of Patent: Mar. 19, 2002

(54) MODULATION DEVICE AND METHOD AND DISTRIBUTION MEDIUM

(75) Inventors: Toshiyuki Nakagawa; Yoshihide Shimpuku, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/208,125

(22) Filed: Dec. 9, 1998

(30) Foreign Application Priority Data

Dec. 12, 1997 (JP) .............................................. 9-342417

(51) Int. Cl.[7] ................................................ H03M 7/02
(52) U.S. Cl. ......................................... 375/253; 341/59
(58) Field of Search .............................. 375/253, 262, 375/268; 341/58, 59

(56) References Cited

U.S. PATENT DOCUMENTS 5,600,315 A * 2/1997 Shimpuku et al. ............. 341/59
5,917,857 A * 6/1999 Tanaka et al. ............... 375/253
6,127,951 A * 10/2000 Nakagawa et al. ........... 341/59
6,172,622 B1 * 1/2001 Nakagawa et al. ........... 341/59

FOREIGN PATENT DOCUMENTS

EP 0 555 832 8/1993
EP 0 560 339 9/1993
EP 0 744 838 11/1996

* cited by examiner

*Primary Examiner*—Chi Pham
*Assistant Examiner*—Dung X. Nguyen
(74) *Attorney, Agent, or Firm*—Frommer Lawrence & Haug LLP; William S. Frommer; Gordon Kessler (57) ABSTRACT

A DSV bit is inserted in an input data string by a DSV bit determining insertion unit. A modulation unit has a conversion table, and the element of the conversion table comprises the element for determining uniquely, and has a conversion rule that residues obtained by dividing the number of "1" in the element of a data string and the number of "1" in the element of a code word string to be converted by 2 are identically 1 or 0 for both residues. A channel bit string is modulated according to the conversion table, and further NRZI modulated by an NRZI modulation unit. Thus, DSV control can be performed with reduced redundancy.

21 Claims, 4 Drawing Sheets

MODULATION DEVICE AND METHOD AND DISTRIBUTION MEDIUM

BACKGROUND OF THE INVENTION

1. Field of the Invention

This invention relates to a modulation device and method, and a distribution medium, and more particularly relates to a modulation device and method, and a distribution medium which are capable of data modulation and DSV control simultaneously so as to be suitable for data transmission and recording in recording media.

2. Description of Related Art

When data is transmitted to a desired transmission line, or for example, data is recorded in a recording medium such as a magnetic disc, optical disc, or magneto-optical disc, the data is modulated so as to be suitable for transmission and recording. The block code has been known as one of such modulation methods. In the block coding, a data string is divided into units composed of m×i bits (referred to as a data word hereinafter), and the data word is converted into the code word composed of n×i bits according to a suitable code rule. The code is a fixed length code if i=1, and the code is a variable length code if a plurality of i can be selected, that is, if a data string is converted using prescribed i in a range from 1 to i-max (maximum i). The block coded code is represented as a variable length code (d, k; m, n; r).

Herein i is referred as a limited length, i-max is r (maximum limited length). d is the minimum consecutive number of "t0" inserted between consecutive "1", for example, the minimum run of 0, k is the maximum consecutive number of "0" inserted between consecutive "1", for example, the maximum run of 0.

When the variable length code obtained as described herein above is recorded, for example, in an optical disc or magneto-optical disc, in the case of a compact disc or minidisc, NRZI (Non Return to Zero Inverted) modulation in which "1" of a variable length code is inverted and "0" is not inverted is performed, and recording is performed based on NRZI modulated variable length code (referred to as a recording waveform string hereinafter). Alternatively, like the magneto-optical disc of ISO standard, there is also provided a system in which recording modulated bit strings are recorded as it is without NRZI modulation.

Assuming that the minimum inversion interval of a recording waveform string is Tmin and the maximum inversion interval of a recording waveform string is Tmax, in order to perform high density recording in the linear speed direction, the longer minimum inversion interval Tmin is preferable, in other words, the smaller maximum run k is preferable, and various modulation method has been proposed.

In detail, there are provided variable length RLL (1-7), fixed length RLL (1-7), and variable length RLL (2-7) as the modulation system proposed, for example, for the optical disc, magnetic disc, or magneto-optical disc.

An example of the variable length RLL (1-7) conversion table is shown herein under:

TABLE 1

RLL (1, 7; 2, 3; 2)

| | data | code |
|---|---|---|
| i=1 | 11 | 00x |
| | 10 | 010 |
| | 01 | 10x |
| i=2 | 0011 | 000 00x |
| | 0010 | 000 010 |
| | 0001 | 100 00x |
| | 0000 | 100 010 |

The character x in the conversion table is 1 if the subsequent channel bit is 0; otherwise the character x is 0 if subsequent channel bit is 1. The limited length r is 2.

The parameter of the RLL (1-7) is (1, 7; 2, 3; 2), the bit interval of a recording waveform string is assumed as T, then the minimum inversion interval Tmin is 2 (=1+1) T. Further, the bit interval of a data string is assumed as Tdata, then the inversion interval Tmin is 33 (=(2/3)×2) Tdata, and the maximum inversion interval Tmax is 8T (5.33 Tdata). Further, the detection window width Tw is represented by (m/n)×Tdata, the value is 0.67 (=2/3) Tdata.

As for the channel bit string modulated according to RLL (1-7), 2T namely Tmin most often occurs, followed by 3T and 4T. Often occurrence of edge information such as 2T and 3T with short period is favorable to clock reproduction, but often occurrence of 2T causes skew of the recording waveform. In other words, the waveform output is small and becomes sensitive to defocus and tangential tilt. Further, in the case of high density recording, recording in which the minimum mark occurs consecutively is sensitive to disturbance such as noise, data reproduction error is apt to occur.

The inventors of this invention proposed previously the code to limit the consecutive occurrence of Tmin in Japanese Patent Publication No. Hei 9-256745. This code is referred to as a RML code (Repeated Minimum run-length Limited code).

In this proposal, assuming that the variable length code (d, k; m, n; r) is a variable length code (1, 7; 2, 3; 3), in other words, the 0 minimum run d is 1 bit, the 0 maximum run k is 7 bits, the base data length m is 2 bits, the base code length n is 3 bits, and the maximum limited length r is 3, then the conversion table is shown in Table 2 herein under.

TABLE 2

RLL-P (1, 7; 2, 3; 3)

| | data | code |
|---|---|---|
| i=1 | 11 | 00x |
| | 10 | 010 |
| | 01 | 10x |
| i=2 | 0011 | 000 00x |
| | 0010 | 000 010 |
| | 0001 | 100 00x |
| | 0000 | 100 010 |
| i=3 | 100110 | 100 000 010 |

Herein, the limited length is 3.

In the case that the data string is "10" in Table 2 as described herein above, particularly in the case that the total 6 data string is "100110" with reference to the following 4 data, by giving a special corresponding code as the code for limiting repetition of the minimum run, repetition of the minimum run is limited at most to 5 times in modulation according to Table 2.

By applying this method, processing for high linear density recording/reproduction of data is stabilized.

When data are recorded in a recording medium or data are transmitted, coding modulation suitable for each medium (transmission) is performed, in the case that a direct current component is included in these modulated codes, for example, fluctuation of various error signals such as tracking error in servo controlling of a disc device is apt to occur, and jitter is apt to occur. Therefore, it is desirable that the direct current component is contained as little as possible.

The modulated code in the variable length RLL (1-7) table and RML (1-7) table described herein above is not subjected to DSV control. In such case, DSV control is performed by inserting the prescribed DSV control bit in the coded string (channel bit string) with a prescribed interval.

A digital sum value (DSV) control means the sum obtained by the operation in which the channel bit string is subjected to NRZI modulation (namely level coding), and codes are added in the manner that "1" of a bit string (symbol of the data) is regarded as +1 and "0" is regarded as −1. DSV is a measure of direct current component of the code string, and the reduced absolute value of DSV indicates the suppressed direct current component of the code string.

The DSV control bit can be 2 (1+1)=4 bits in the case of 2×(d+1) namely d=1. When, the minimum run and the maximum run are maintained with an arbitrary interval, and perfect DSV control in which inversion and non inversion are possible is performed.

However, DSV control bit is basically the redundant bit. Therefore, the number of DSV control bits is desirably as small as possible in view of the code conversion efficiency.

For example, in the case that the control bit is 1×(d+1) namely d=1, 1×(1+1)=2 bits may be possible. In this case, perfect DSV control in which inversion and non inversion are possible is performed with an arbitrary interval. However, though the minimum run is maintained, the maximum run increases to (k+2). As for the code, the minimum run should be maintained without exception, but the maximum run is maintained not necessarily. Depending on the case, the format having the pattern which breaks the maximum run used as the sync signal has been known. For example, the maximum run of EFM plus of DVD is 11T, but 14T is allowed to be favorable for the format.

It is required that control bit for DSV control is inserted with an arbitrary interval in RLL (1-7) codes or RML (1-7) codes which are not subjected to DSV control out of RLL codes as described herein above. However for codes of d=1, 4 bits of control bit are required to maintain the minimum run and the maximum run, and 2 bit of control bit are required even though control is performed without maintaining the maximum run.

SUMMARY OF THE INVENTION

The present invention was accomplished in view of such problem, and it is an object of the present invention to provide perfect DSV control with efficient control bit maintaining the minimum run and the maximum run.

It is another object of the present invention to provide efficient data conversion.

It is another object of the present invention to provide stable data reproduction with the maximum run k=7.

It is a further object of the present invention to provide stable reproduction with limited repetition of the minimum run and without increment of limited length r.

The modulation device described in claim 1 is provided with the conversion table of the modulation means which has the minimum run d of 1, has a variable length structure, has elements which are determined uniquely, and has a conversion rule that residues obtained by dividing the number of "1" in the element of a data string and the number of "1" in the element of a code word string to be converted by 2 are identically 1 or 0 for both residues.

The modulation method described in claim 6 involves the conversion table which has the minimum run d of 1, has a variable length structure, has elements which are determined uniquely, and has a conversion rule that residues obtained by dividing the number of "1" in the element of a data string and the number of "1" in the element of a code word string to be converted by 2 are identically 1 or 0 for both residues.

The distribution medium described in claim 7 is a computer program for converting a data having a base data length of m bits to a variable length code having a base code length of n bits (d, k; m, n; r) based on a conversion table, wherein the conversion table has the minimum run d of 1, has a variable length structure, has elements which are determined uniquely, and has a conversion rule that residues obtained by dividing the number of "1" in the element of a data string and the number of "1" in the element of a code word string to be converted by 2 are identically 1 or 0 for both residues.

The modulation device described in claim 8 has the conversion table of the modulation means which has the minimum run d of 1, has a variable length structure, has elements having an indefinite code, and has a conversion rule that residues obtained by dividing the number of "1" in the element of a data string and the number of "1" in the element of a code word string to be converted by 2 are identically 1 or 0 for both residues.

The modulation method described in claim 14 involves the conversion table which has the minimum run d of 1, has a variable length structure, has elements having an indefinite code, and has a conversion rule that residues obtained by dividing the number of "1" in the element of a data string and the number of "1" in the element of a code word string to be converted by 2 are identically 1 or 0 for both residues.

The distribution medium described in claim 15 is a computer program which converts a data having a base data length of m bits to a variable length code having a base code length of n bits (d, k; m, n; r) based on a conversion table, wherein the conversion table has the minimum run d of 1, has a variable length structure, has elements having an indefinite code, and has a conversion rule that residues obtained by dividing the number of "1" in the element of a data string and the number of "1" in the element of a code word string to be converted by 2 are identically 1 or 0 for both residues.

The modulation device described in claim 16 is provided with the conversion table of the modulation means which has the minimum run d of 1, has a variable length structure, has a code for limiting consecution of the minimum run, and has a conversion rule that residues obtained by dividing the number of "1" in the element of a data string and the number of "1" in the element of a code word string to be converted by 2 are identically 1 or 0 for both residues.

The modulation method described in claim 20 involves the conversion table which has the minimum run d of 1, has a variable length structure, has a code for limiting consecution of the minimum run, and has a conversion rule that residues obtained by dividing the number of "1" in the element of a data string and the number of "1" in the element of a code word string to be converted by 2 are identically 1 or 0 for both residues.

The distribution medium described in claim 21 is a computer program which converts a data having a base data length of m bits to a variable length code having a base code length of n bits (d, k; m, n; r) based on a conversion table, wherein the conversion table has the minimum run d of 1, has a variable length structure, has a code for limiting consecution of the minimum run, and has a conversion rule that residues obtained by dividing the number of "1" in the element of a data string and the number of "1" in the element of a code word string to be converted by 2 are identically 1 or 0 for both residues.

In the modulation device described in claim 1, the modulation method described in claim 6, and the distribution medium described in claim 7, the element in the conversion table is composed of the element which is determined uniquely, and has the conversion rule that residues obtained by dividing the number of "1" in the element of a data string and the number of "1" in the element of a code word string to be converted by 2 are identically 1 or 0 for both residues.

In the modulation device described in claim 8, the modulation method described in claim 14, and the distribution medium described in claim 15, the conversion table is composed of the indefinite code and has the conversion rule that residues obtained by dividing the number of "1" in the element of a data string and the number of "1" in the element of a code word string to be converted by 2 are identically 1 or 0 for both residues.

In the modulation device described in claim 16, the modulation method described in claim 20, and distribution medium described in claim 21, the conversion table has the code for limiting consecution of the minimum run and has the conversion rule that residues obtained by dividing the number of "1" in the element of a data string and the number of "1" in the element of a code word string to be converted by 2 are identically 1 or 0 for both residues.

DESCRIPTION OF THE PREFERRED EMBODIMENTS

The embodiments of the present invention will be described in detail hereinafter, to clearly describe the correspondent relation between each means of the invention described in claims and the embodiments described hereinafter, a corresponding embodiment (one example) is added in parentheses located just after each means, and the feature of the present invention is described hereinafter. However, of course, the description of the embodiments does not mean that each means is limited to the described embodiments.

The modulation device described in claim 1 is provided with the conversion table of the modulation means (for example, modulation unit 12 in FIG. 1) which has the minimum run d of 1, has a variable length structure, has elements which are determined uniquely, and has a conversion rule that residues obtained by dividing the number of "1" in the element of a data string and the number of "1" in the element of a code word string to be converted by 2 are identically 1 or 0 for both residues.

The modulation device described in claim 4 is provided additionally with a DSV control means (for example, DSV bit determining inserting unit 11 shown in FIG. 1) for controlling DSV of the input data and for supplying the DSV to a modulation means.

The modulation device described in claim 8 has the conversion table of the modulation means (for example, modulation unit 12 shown in FIG. 1) which has the minimum run d of 1, has a variable length structure, has elements having an indefinite code, and has a conversion rule that residues obtained by dividing the number of "1" in the element of a data string and the number of "1" in the element of a code word string to be converted by 2 are identically 1 or 0 for both residues.

The modulation device described in claim 16 is provided with the conversion table of the modulation means (for example, modulation unit 12 shown in FIG. 1) which has the minimum run d of 1, has a variable length structure, has a code for limiting consecution of the minimum run, and has a conversion rule that residues obtained by dividing the number of "1" in the element of a data string and the number of "1" in the element of a code word string to be converted by 2 are identically 1 or 0 for both residues.

The modulation device described in claim 19 is provided additionally with a DSV control means (for example, DSV bit determining insertion unit 11 shown in FIG. 1) for controlling DSV of the input data and for supplying the DSV to a modulation means.

Embodiments of the present invention will be described in detail with reference to the drawings. In the embodiments described hereinafter, the present invention is applied to a modulation device which uses a conversion table for converting the data to the variable length code (k, k; m, n; r), Table 3 to Table 13 are tables which show the feature of the present invention.

TABLE 3

RLL (1, 7) plus data-bit-DSV control
(d, k; m, n; r) = (1, 7; 2, 3; 4)

| data | code |
| --- | --- |
| 10 | 100 |
| 01 | 010 |
| 1110 | 000 100 |
| 1101 | 101 010 |
| 1111 | 001 010 |
| 1100 | 101 000 |
| 0010 | 000 010 |
| 0001 | 001 000 |
| 001110 | 001 001 010 |
| 001101 | 101 001 000 |
| 001111 | 101 001 010 |
| 001100 | 001 001 000 |
| 000010 | 000 101 010 |
| 000000 | 000 101 000 |
| 00000110 | 001 001 001 010 |
| 00000101 | 010 000 001 000 |
| 00000111 | 010 000 001 010 |
| 00000100 | 001 001 001 000 |
| 00001110 | 101 001 001 010 |
| 00001101 | 000 101 001 000 |
| 00001111 | 000 101 001 010 |
| 00001100 | 101 001 001 000 |

In Table 3, the minimum run d=1, the structure is variable length, and the conversion table has elements respectively to be determined uniquely (contain no indefinite code including an indefinite bit such as x in the above-mentioned Table 1 or Table 2). In other words, if 2 bits of a conversion data string are identical in Table 3, then the data is converted immediately to a code word string.

Table 3 involves a conversion rule that residues obtained by dividing the number of "1" in the element in a data string and the number of "1" in the element of a code word string to be converted by 2 are identical 1 or 0 for both residues. In detail, the element of the data string "1110" corresponds to the code word string "000100", the number of "1" of the data string is 3 and the number of "1" of the corresponding code word string is 1, residues obtained by dividing 3 and 1 by 2 are 1 for both and the residues are identical. Similarly, the element of the data string "1111" corresponds to the code word string "001010", the number of "1" of the data string is 4 and the number of "1" of the corresponding data word string is 2, residues obtained by dividing 4 and 2 by 2 are 0 for both and the residues are identical. In Table 3, the limited length r=4. The constrain length r must be at least 4 to give the maximum run k=7.

As another example, a table for the maximum run k=8 is shown in Table4. The limited length r=3. To give the maximum run k=8, the limited length must be at least 3.

TABLE 4

RLL (1, 8) plus data-bit-DSV control
(d, k; m, n; r) = (1, 8; 2, 3; 3)

| data | code |
| --- | --- |
| 10 | 100 |
| 01 | 010 |
| 1110 | 000 100 |
| 1101 | 001 000 |
| 1111 | 101 000 |
| 1100 | 001 010 |
| 0010 | 101 010 |
| 0001 | 000 010 |
| 001110 | 001 001 010 |
| 001101 | 101 001 000 |
| 001111 | 001 001 000 |
| 001100 | 101 001 010 |
| 000010 | 000 101 010 |
| 000001 | 000 001 000 |
| 000011 | 000 101 000 |
| 000000 | 000 001 010 |

TABLE 5

RML (1, 7) plus data-bit-DSV control
(d, k; m, n; r) = (1, 7; 2, 3; 4)

| data | code |
| --- | --- |
| 10 | 100 |
| 01 | 010 |
| 1110 | 000 100 |
| 1101 | 101 010 |
| 1111 | 001 010 |
| 1100 | 101 000 |
| 0010 | 000 010 |
| 0001 | 001 000 |
| 001110 | 001 001 010 |
| 001101 | 101 001 000 |
| 001111 | 101 001 010 |
| 001100 | 001 001 000 |
| 000010 | 000 101 010 |
| 000000 | 000 101 000 |
| 00000110 | 001 001 001 010 |
| 00000101 | 010 000 001 000 |
| 00000111 | 010 000 001 010 |
| 00000100 | 001 001 001 000 |
| 00001110 | 101 001 001 010 |
| 00001101 | 000 101 001 000 |
| 00001111 | 000 101 001 010 |
| 00001100 | 101 001 001 000 |
| 11011101 | 100 000 001 000 |

Table 5 has the minimum run d=1, the variable length structure, and the rewrite code to limit the consecutive minimum run in the conversion table. In detail, the code word string after data conversion is limited in the number of repetition of the minimum run, the minimum run can repeat up to 7 times.

Table 5 involves a conversion rule that residues obtained by dividing the number of "1" in the element in a data string and the number of "1" in the element of a code word string to be converted by 2 are identically 1 or 0 for both residues. In detail, the element of the data string "1110" corresponds to the code word string "000100", the number of "1" of the data string is 3 and the number of "1" of the corresponding code word string is 1, residues obtained by dividing 3 and 1 by 2 are 1 for both and the residues are identical. Similarly, the element of the data string "1111" corresponds to the code word string "001010 ", the number of "1" of the data string is 4 and the number of "1" the corresponding data word string is 2, residues obtained by dividing 4 and 2 by 2 are 0 for both and the residues are identical.

In Table 5, the limited length r=4. The constrain length must be at least 4 to give the maximum run k=7. Even if a code to limit repetition of the minimum run is added, the limited length does not increase.

TABLE 6

RLL (1, 7) plus data-bit-DSV control
(d, k; m, n; r) = (1, 7; 2, 3; 4)

| data | code |
|---|---|
| 11 | *0* |
| 10 | 010 |
| 01 | 001 |
| 0011 | 010 100 |
| 0010 | 000 100 |
| 0001 | 010 000 |
| 000011 | 000 100 100 |
| 000010 | 010 100 100 |
| 00000111 | 000 100 100 100 |
| 00000110 | 000 100 000 010 |
| 00000101 | 000 100 000 001 |
| 00000100 | 000 100 000 101 |
| 00000011 | 010 100 100 100 |
| 00000010 | 010 100 000 010 |
| 00000001 | 010 100 000 001 |
| 00000000 | 010 100 000 101 |

(Before 0*=1, Before 1: *=0)

Table 6 has the minimum run d=1, the variable length structure, and the indefinite code in the element in the conversion table. In detail, if 2 bits of a conversion data string in Table 6 is "11", "000" or "101" is selected according to the conversion data string located immediately before. If the conversion data string located immediately before is "01", "00000101", "00000100", "00000001", or "00000000", the data "11" is converted to the code "000" to maintain the minimum run. Otherwise, the data "11" is converted to the code "101".

Table 6 involves a conversion rule that residues obtained by dividing the number of "1" in the element in a data string and the number of "1" in the element of a code word string to be converted by 2 are identically 1 or 0 for both residues. In detail, the element of the data string "0011" corresponds to the code word string "010100", the number of "1" of the data string is 2 and the number of "1" of the corresponding code word string is 2, residues obtained by dividing 2 and 2 by 2 are 0 for both and the residues are identical. Similarly, the element of the data string "0010" corresponds to the code word string "000100", the number of "1" of the data string is 1 and the number of "1" of the corresponding data word string is 1, residues obtained by dividing 1 and 1 by 2 are 1 for both and the residues are identical. The indefinite code (*0*) is given at two locations to each element in Table 6 to render the residue obtained by dividing the number of "1" in the element by 2 identical.

In Table 6, the limited length r=4. The constrain length r must be at least 4 to give the maximum run k=7.

TABLE 7

RML (1, 7) plus data-bit-DSV control
(d, k; m, n; r) P (1, 7; 2, 3; 4)

| data | code |
|---|---|
| 11 | *0* |
| 10 | 010 |
| 01 | 001 |
| 0011 | 010 100 |
| 0010 | 000 100 |
| 0001 | 010 000 |
| 000011 | 000 100 100 |
| 000010 | 010 100 100 |
| 00000111 | 000 100 100 100 |
| 00000110 | 000 100 000 010 |
| 00000101 | 000 100 000 001 |
| 00000100 | 000 100 000 101 |
| 00000011 | 010 100 100 100 |
| 00000010 | 010 100 000 010 |
| 00000001 | 010 100 000 001 |
| 00000000 | 010 100 000 101 |
| 10111011 | 001 000 000 010 |

(Before 0*=1, Before 1: *=0)

Table 7 has the minimum run d=1, the variable length structure, the indefinite code in the element in the conversion table, and the rewrite code to limit the continuous minimum run. In detail, the code word string after data conversion is limited in the number of repetition of the minimum run, the minimum run can repeat up to 7 times.

If 2 bits of a conversion data string in Table 7 is "11", "000" or "101" is selected according to the conversion data string located immediately before. If the conversion data string located immediately before is "01", "00000101", "00000100", "00000001", or "00000000", the data "11" is converted to the code "000" to maintain the minimum run. Otherwise, the data "11" is converted to the code "101".

Table 7 involves a conversion rule that residues obtained by dividing the number of "1" in the element in a data string and the number of "1" in the element of a code word string to be converted by 2 are identically 1 or 0 for both residues. In detail, the element of the data string "0011" corresponds to the code word string "010100", the number of "1" of the data string is 2 and the number of "1" of the corresponding code word string is 2, residues obtained by dividing 2 and 2 by 2 are 0 for both and the residues are identical. Similarly, the element of the data string "0010" corresponds to the code word string "000100", the number of "1" of the data string is 1 and the number of "1" of the corresponding data word string is 1, residues obtained by dividing 1 and 1 by 2 are 1 for both and the residues are identical. The indefinite code (*0*) is given at two locations to each element in Table 7 to render the residue obtained by dividing the number of "1" in the element by 2 identical.

In Table 7, the limited length r=4. The constrain length r must be at least 4 to give the maximum run k=7. Even if a code to limit repetition of the minimum run is added, the limited length does not increase.

TABLE 8

RLL (1, 7) plus data-bit-DSV control
(d, k; m, n; r) = (1, 7; 2, 3; 4)

| data | code |
|---|---|
| 11 | *0* |
| 10 | 100 |
| 01 | 010 |
| 0011 | 001 010 |
| 0010 | 001 000 |
| 0001 | 000 010 |
| 000011 | 001 001 000 |
| 000010 | 001 001 010 |
| 00000111 | 001 001 001 000 |
| 00000110 | 001 001 001 010 |
| 00000101 | 100 000 001 000 |
| 00000100 | 100 000 001 010 |
| 00000011 | 010 000 001 000 |
| 00000010 | 010 000 001 010 |
| 00000001 | 010 000 101 000 |
| 00000000 | 010 000 000 100 |

Table 8 has the minimum run d=1, the variable length structure, and the indefinite code in the element in the conversion table. In detail, if 2 bits of a conversion data string in Table 6 is "11", "000" or "101" is selected according to the conversion data string located immediately before. If the subsequent conversion data string is "10", "00000101", or "00000100", the data "11" is converted to the code "000" to maintain the minimum run. Otherwise, the data "11" is converted to the code "101".

Table 8 involves a conversion rule that residues obtained by dividing the number of "1" in the element in a data string and the number of "1" in the element of a code word string to be converted by 2 are identically 1 or 0 for both residues. In detail, the element of the data string "0011" corresponds to the code word string "001010", the number of "1" of the data string is 2 and the number of "1" of the corresponding code word string is 2, residues obtained by dividing 2 and 2 by 2 are 0 for both and the residues are identical. Similarly, the element of the data string "0010" corresponds to the code word string "001000", the number of "1" of the data string is 1 and the number of "1" of the corresponding data word string is 1, residues obtained by dividing 1 and 1 by 2 are 1 for both and the residues are identical.

The indefinite code (*0*) is given at two locations to each element in Table 8 to render the residue obtained by dividing the number of "1" in the element by 2 identical.

In Table 8, the limited length r=4. The constrain length r must be at least 4 to give the maximum run k=7.

TABLE 9

RML (1, 7) plus data-bit-DSV control
(d, k; m, n; r) = (1, 7; 2, 3; 4)

| data | code |
|---|---|
| 11 | *0* |
| 10 | 100 |
| 01 | 010 |
| 0011 | 001 010 |
| 0010 | 001 000 |
| 0001 | 000 010 |
| 000011 | 001 001 000 |
| 000010 | 001 001 010 |
| 00000111 | 001 001 001 000 |
| 00000110 | 001 001 001 010 |
| 00000101 | 100 000 001 000 |
| 00000100 | 100 000 001 010 |
| 00000011 | 010 000 001 000 |
| 00000010 | 010 000 001 010 |
| 00000001 | 010 000 101 000 |
| 00000000 | 010 000 000 100 |
| 01110111(01) | 010 000 101 001 |

Table 9 has the minimum run d=1, the variable length structure, the indefinite code in the element in the conversion table, and the rewrite code to limit the continuous minimum run. In detail, the code word string after data conversion is limited in the number of repetition of the minimum run, the minimum run can repeat up to 10 times.

Table 9 involves a conversion rule that residues obtained by dividing the number of "1" in the element in a data string the number of "1" in the element of a code word string to be converted by 2 are identically 1 or 0 for both residues. In detail, the element of the data string "0011" corresponds to the code word string "001010", the number of "1" of the data string is 2 and the number of "1" of the corresponding code word string is 2, residues obtained by dividing 2 and 2 by 2 are 0 for both and the residues are identical. Similarly, the element of the data string "0010" corresponds to the code word string "001000", the number of "1" of the data string is 1 and the number of "1" the corresponding data word string is 1, residues obtained by dividing 1 and 1 by 2 are 1 for both and the residues are identical. The indefinite code (*0*) is given at two locations to each element in Table 7 to render the residue obtained by dividing the number of "1" in the element by 2 identical.

In Table 9, the limited length r=4. The constrain length r must be at least 4 to give the maximum run k=7. Even if a code to limit repetition of the minimum run is added, the limited length does not substantially increase.

When any one of conversion tables shown in Table 3 to Table 9 is used, data strings are modulated as before, and DSV control is performed with a predetermined interval of modulated channel bit strings as before. In addition, when any one of conversion tables shown in Table 3 to Table 9 is used, DSV control is performed more efficiently due to the relation between the data string and the code word string to be converted.

In detail, in conversion tables, the conversion rule that residues obtained by dividing the number of "1" in the element of a data string and the number of "1" in the element of a code word string to be converted in a conversion table are identically 1 or 0 for both residues provide a function to insert "1" for "inversion" and insert "0" for "non inversion" by inserting "1" which represents "inversion" or by inserting "0" which represents "non inversion" with data bit string in the channel bit insertion as described herein above.

For example, in Table 7, it is assumed that when 3 bits to be subjected to data conversion are consecutive as "001", a DSV control bit is inserted after the 3 bits, the data conversion will generate "001-x".

Herein if "1" is given to x, the data string and code word string will be as described herein under.

| data string | code word string |
|---|---|
| 0011 | 010 100 |

Alternatively, if "0 is given to x, the data string and code word string will be as described herein under.

| data string | code word string |
|---|---|
| 0010 | 000 100 |

The code word string is subjected to NRZI modulation to generate level code string as shown herein under.

| data string | code word string | level code string |
|---|---|---|
| 0011 | 010 100 | 011000 |
| 0010 | 000 100 | 000111 |

Herein, the final level code string is inverted. In other words, by selecting "1" or "0" of DSV control bit, DSV control can be performed in the data string.

From the above-mentioned DSV control, in terms of redundancy due to DSV control, DSV control with 1 bit in a data string is equivalent to DSV control with 1.5 channel bit based on the conversion rate m=2 and n=3 in expression of channel bit string. If DSV control is performed in a channel bit string, DSV control is performed with 2 channel bits, but Tmax (the maximum inversion interval) increases.

Figure 1:
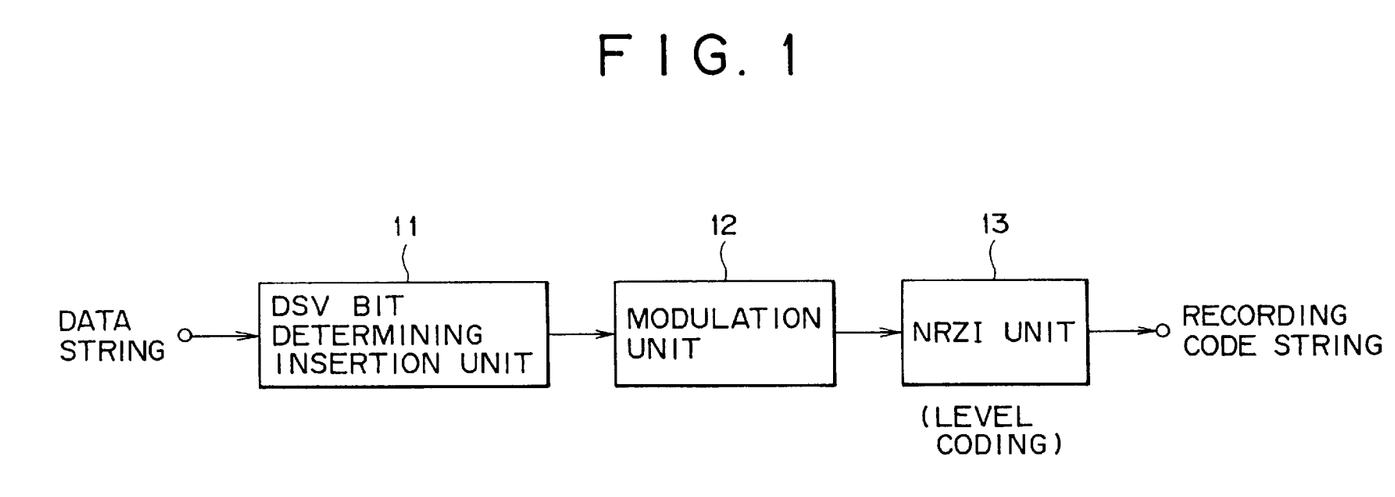
FIG. 1 is a block diagram for illustrating a structure of the modulation device of the present invention.

FIG. 1 shows an exemplary structure of the modulation device for modulating data and generating output using the above-mentioned conversion table. As shown in FIG. 1, the modulation device is provided with a DSV bit determining insertion unit 11 for performing DSV control with a predetermined interval from the data string and for determining and inserting DSV bit "1" or "0" with a predetermined interval, a modulation unit 12 for modulating a data string into which a DSV bit supplied from the DSV bit determining insertion unit 11, and an NRZI unit 13 for converting the modulated code string supplied from the modulation unit 12 to a recording waveform string. Further, a timing management unit for generating and supplying timing signals to respective components to manage the timing is provided though it is not shown in the drawing.

Figure 2:
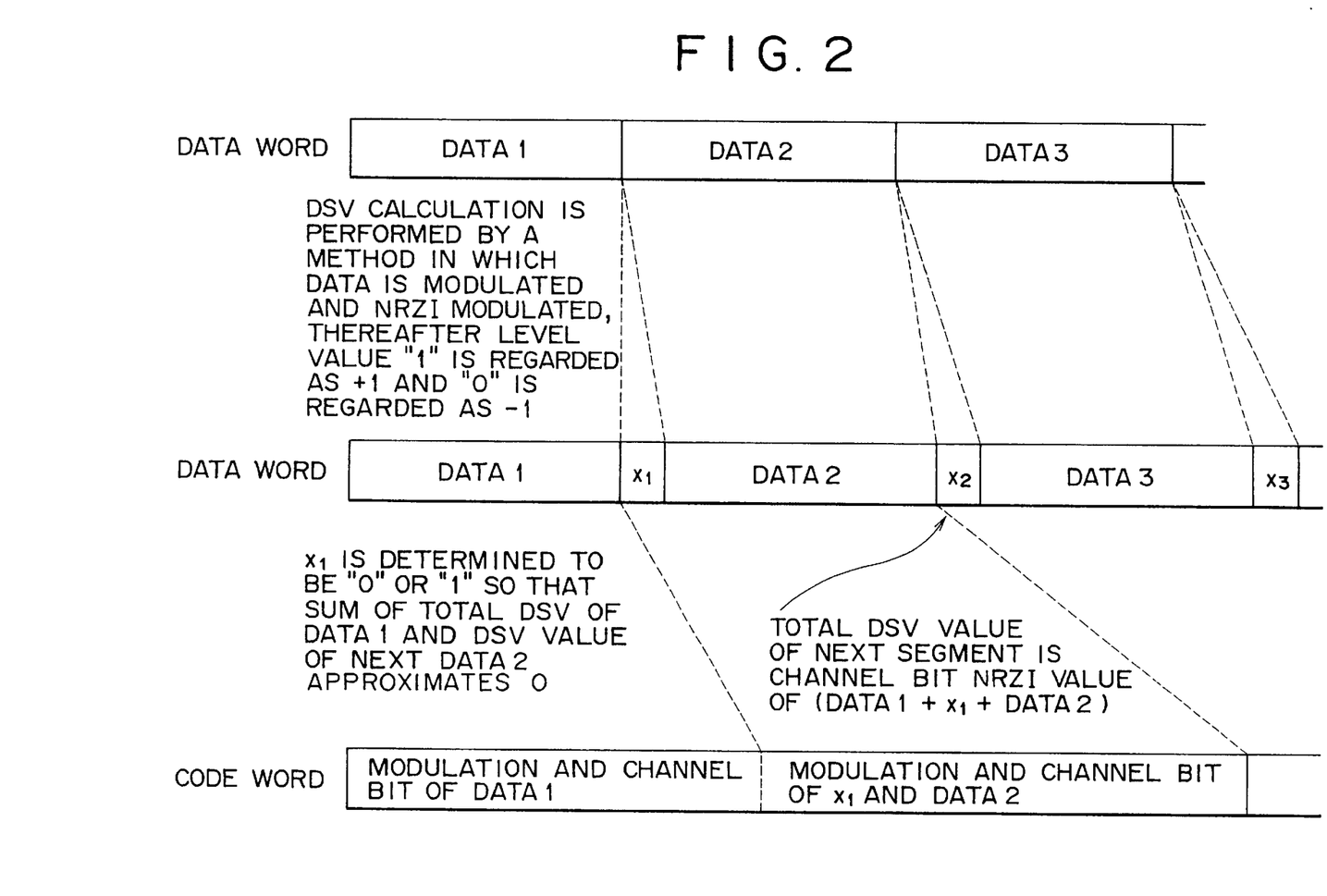
FIG. 2 is a diagram for describing operations of a DSV bit determining insertion unit 11 shown in FIG. 1.

FIG. 2 is a drawing for describing the DSV bit determining and inserting processing shown in FIG. 1. Determination and insertion of DSV bit is carried out every arbitrary predetermined interval in the data string. As shown in FIG. 2, to insert a DSV control bit between DATA 1 and DATA 2, the cumulative DSV from DATA 1 is calculated. The segmental DSV of the next segment DATA 2 is calculated. The DSV value is obtained through a process in which DATA 1 and DATA 2 are converted respectively to channel bit strings and modulated to level codes (NRZI modulation), and level codes are accumulated with regarding the level H ("1") as +1 and the level L ("0") as −1. The DSV control bit to be inserted is determined so that the absolute value of the cumulative DSV obtained by combining the cumulative DSV value up to DATA 1 and the segmental DSV of the next DATA 2 with interposition of the DSV control bit becomes close to zero.

Giving "1" to "x1" that is the DSV bit in FIG. 2 means inversion of the code of the segmental DSV namely DATA 2 which is subsequent to DATA 1, and giving "0" means non inversion of the segmental DSV namely DATA 2. Because the conversion rule is applied to the element in respective tables shown in Table 3 to Table 9 described hereinbefore so that residues obtained by dividing the number of "1" in the element of a data string and the number of "1" in the element of a code word string to be converted by 2 are identically 1 or 0 for both residues, insertion of "1" in the data string means insertion of "1" in the code word string to be converted subsequently, namely inversion.

As described herein above, the DSV control bit namely x1 between DATA 1 and DATA 2 in FIG. 2 is determined, and next, DSV control is performed in the same manner using the DSV control bit namely x2 between DATA 2 and DATA 3. When, the cumulative DSV value is the total DSV value of DATA 1, x1, and DATA 2.

As shown in FIG. 2, the DSV bit is inserted previously in the data string and thereafter modulated to generate the channel bit string.

Figure 3:
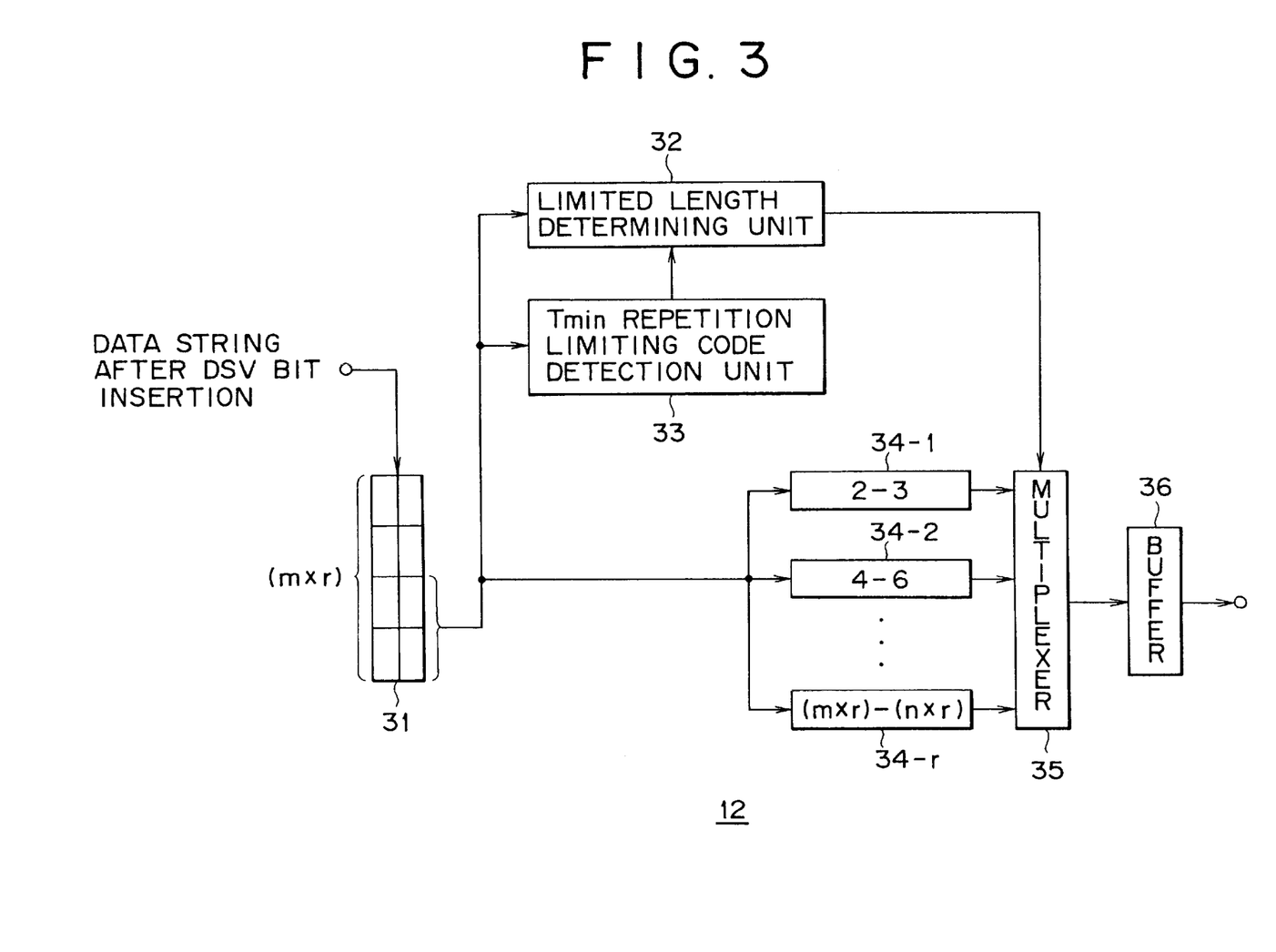
FIG. 3 is a block diagram for illustrating a structure of the modulation unit 12 shown in FIG. 1.

FIG. 3 is a block diagram for illustrating an exemplary structure of the modulation unit 12 of the modulation device shown in FIG. 1. In FIG. 3, a shift register 31 supplies data having inserted DSV control bits to a limited length determining unit 32, Tmin repetition limiting code detection unit 33, and all the conversion units 34-1 to 34-$r$ with shifting 2 bits by 2 bits the data to which the DSV control bit supplied from the DSV bit determining insertion unit 11 is inserted.

The limited determining unit 32 determines the limited length i of the data, and supplies it to a multiplexer 35. The Tmin repetition limiting code detection unit 33 supplies the signal to the limited length determining unit 32 when detecting the exclusive code.

When the Tmin repetition limiting code detection unit 33 detects a Tmin repetition liming code, the limited length determining unit 32 supplies a predetermined limited length to the multiplexer 35. When, though the limited length determining unit 32 may determine another limited length, however, in the case that there is an output from the Tmin repetition limiting code detection unit 33, the limited length determining unit 32 determines the limited length with preference for the latter over the former.

The conversion units 34-1 to 34-$r$ determine whether the conversion rule corresponding to the supplied data is registered with reference to the built-in conversion table (any one of tables out of Table 3 to Table 7), if the conversion rule is registered, then the conversion units 34-1 to 34-$r$ convert the data according to the conversion rule and supply the converted code to the multiplexer 35. If the conversion rule is not registered, then the conversion units 34-1 to 34-$r$ discards the supplied data.

The multiplexer 35 receives the code which the conversion unit 34-$i$ has converted corresponding to the limited length i supplied from the limited length determining unit 32, and supplies the code as a serial data through a buffer 36.

The timing management unit not shown in the drawing generates a clock, generates a timing signal synchronously with the clock, and supplies the timing signal to respective components to perform timing management.

Next, operations of this embodiment is described.

First, the data is supplied in 2 bit unit from the shift register 31 to the respective conversion units 34-1 to 34-r, the limited length determining unit 32, and the Tmin repetition limiting code detection unit 33.

The limited length determining unit 32 has a built-in conversion table as shown, for example, in Table 5, determines the limited length i of the data with reference to the conversion table, and supplies the determined result (limited length i) to the multiplexer 35.

The Tmin repetition limiting code detection unit 33 has a built-in repetition limiting code part (in the case of Table 5, the part to convert the data "11011101") of the conversion table shown in Table 5, detects the code for limiting the repetition of Tmin with reference to the conversion table, and when the code ("11011101") is detected, the Tmin repetition limiting code detection unit 33 supplies a detection signal for indicating the limited length i=4 corresponding to the detected code to the limited length determining unit 32.

When the limited length determining unit 32 receives the detection signal from the Tmin repetition limiting code detection unit 33, even if another limited length is determined independently at the time, another limited length is not selected, the limited length based on the Tmin repetition limiting code is supplied to the multiplexer 35.

Figure 4:
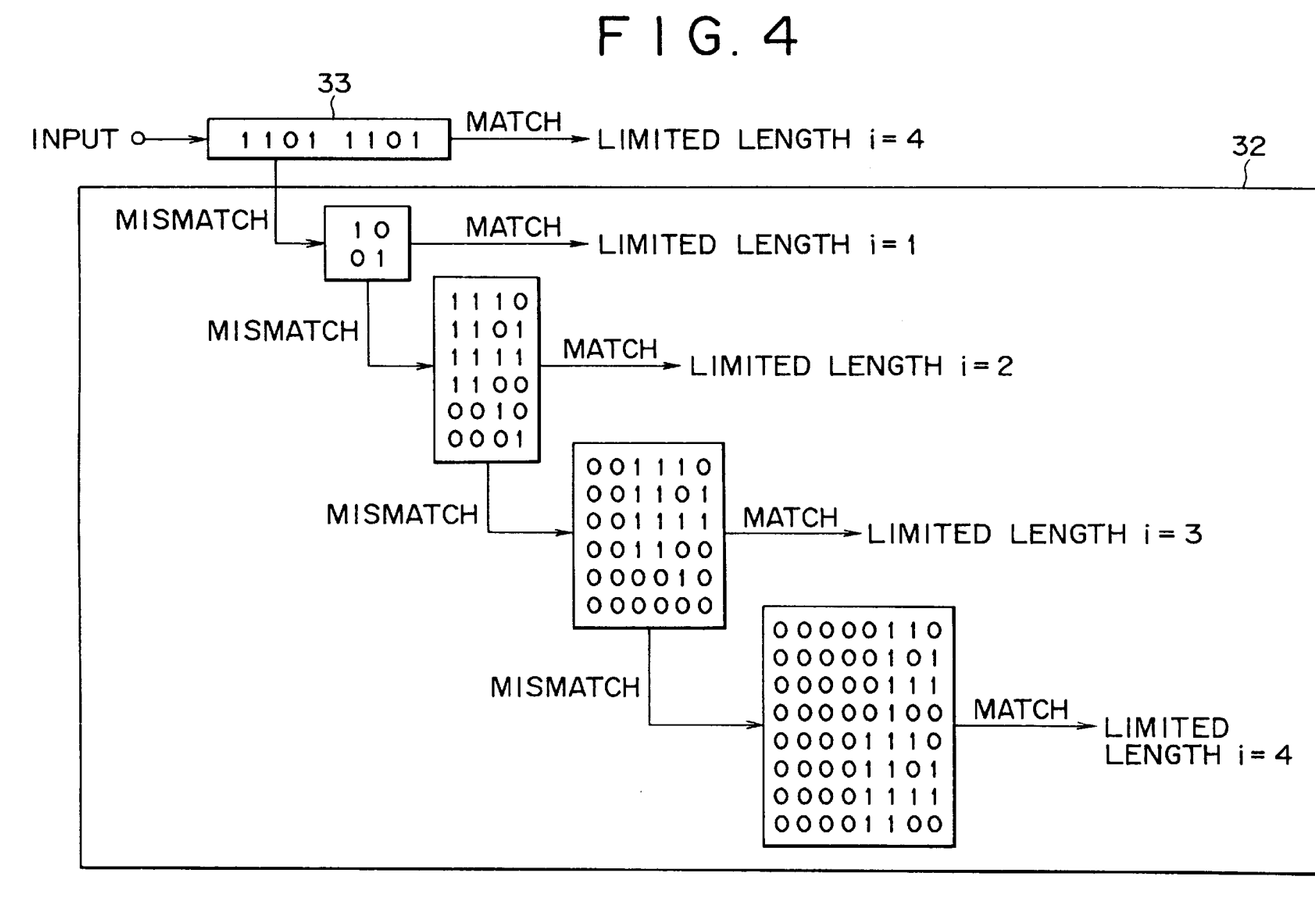
FIG. 4 is a diagram for describing operations of a limited length determining unit 32 and a minimum run repetition limiting code detection unit 33 shown in FIG. 3.

FIG. 4 is a diagram for describing operations of the limited length determining unit 32 and the Tmin repetition limiting code detection unit 33. The Tmin repetition limiting code detection unit 33 has the conversion part "11011101" of the table shown in Table 5, if the input 8 bit data is identical with this conversion part, then a predetermined detection signal is supplied to the limited length determining unit 32. Further the limited length determining unit 32 has a built-in table shown in Table 5, and determines first whether 2 bits of the input data are identical with any one of "10" and "01". If the input data is identical with any one of "10" and "01", the limited length determining unit 32 determines the limited length i to be 1, on the other hand, if the input data is not identical with each of "10" and "01", another 2 bits are added, and the limited length determining unit 32 determines whether the total 4 bit data is identical with any one of "1110", "1101", "1111", "1100", "0010", and "0001" with reference to the total 4 bits.

If the input data is identical with any one of "1110", "1101", "1111", "1100", "0010", and "0001", then the limited length determining unit 32 determines the limited length i to be 2.

If the input data is "1101", then the Tmin repetition limiting code detection unit 33, which sees ahead 4 bits in addition to the original 4 bits, determines whether the total bits are identical with –11011101" (Tmin repetition limiting code), and if the input 8 bits is not identical with "11011101", then the limited length determining unit 32 determines the limited length i to be 2. On the other hand, if the input 8 bits is identical with "11011101", then the limited length determining unit 32 determines the limited length i to be 4 instead of the limited length i=2 based on the output signal from the Tmin repetition limiting code detection unit 33. If the input data is not identical with any one of the above-mentioned "1110", "1101", "1111", "1100", "0010", and "0001", further 2 bits are added and the total 6 bits are referred.

Similarly in the following, the data is referred up to the total of 8 bits according to the table shown in Table 5, and the limited length of data string for all the "1" and "0" is determined.

The limited length determining unit 32 supplies the limited length i determined as described herein above to the multiplexer 35.

Processing for limited length determination by the limited length determining unit 32 may be performed in the order i=4, i=3, i=2, and i=1 with beginning from the largest limited length differently from the order shown in FIG. 4. In this case, the limited length is determined in the same manner as described herein above.

On the other hand, the conversion units 34-i (34-1 to 34-r) have tables corresponding to respective limited length i, in the case that the conversion rule corresponding to the supplied data is registered in the table, the supplied 2×i bit data is converted to 3×i bit code using this conversion rule, and the code is supplied to the multiplexer 35.

The multiplexer 35 selects a code supplied from the conversion unit 34-i corresponding to the limited length i supplied from the limited determining unit 32, and supplies the code as a serial data through the buffer 36.

Herein, for example, in Table 5, if there is no Tmin repetition limiting table of i=4, it results in, for example, Table 3. When, if "1101110111011101" is supplied as a data, then the converted code word string is converted to a code "101-010" with regarding the initial "1101 as i=2 data. The next "1101" and the second next "1101" are converted to a code "101-010" similarly.

When the code generated as described herein above is converted to the level code by, for example, NRZI, the code is converted to a signal having the inverted logic at the timing of "1", therefore, the code word string is converted to "110011001100110011", namely a code in which the minimum inversion interval of 2T repeats 9 times consecutively. Further, if "1101" is supplied continuously as a data string, then the minimum inversion interval of 2T continues for long time.

On the other hand, if the conversion table of i=4 in Table 5 is employed, the special code "11011101" out of the data is converted to a code "100000001000". As the result, long continuous minimum inversion interval Tmin is prevented. In the of Table 5, the maximum consecution of the minimum inversion interval Tmin is 7 times.

Table 5 gives

| 11011101 | 100 000 001 000 | as the Tmin repetition limiting code, however, further by giving additionally a non duplicate code as the Tmin repetition limiting code, two Tmin repetition limiting codes described herein under may be provided.

| | |
|---|---|
| 11011101 | 100 000 001 000 |
| 00001011 | 100 000 001 010 |

When, Table 5 is changed to the table shown in Table 10 described herein under. In the case of Table 8, the maximum consecutive repetition of the minimum inversion interval Tmin is 6 times.

TABLE 10

RML (1, 7) plus data-bit-DSV control
(d, k; m, n; r) = (1, 7; 2, 3; 4)

| data | code |
|---|---|
| 10 | 100 |
| 01 | 010 |
| 1110 | 000 100 |
| 1101 | 101 010 |
| 1111 | 001 010 |
| 1100 | 101 000 |
| 0010 | 000 010 |
| 0001 | 001 000 |
| 001110 | 001 001 010 |
| 001101 | 101 001 000 |
| 001111 | 101 001 010 |
| 001100 | 001 001 000 |
| 000010 | 000 101 010 |
| 000000 | 000 101 000 |
| 00000110 | 001 001 001 010 |
| 00000101 | 010 000 001 000 |
| 00000111 | 010 000 001 010 |
| 00000100 | 001 001 001 000 |
| 00001110 | 101 001 001 010 |
| 00001101 | 000 101 001 000 |
| 00001111 | 000 101 001 010 |
| 00001100 | 101 001 001 000 |
| 11011101 | 100 000 001 000 |
| 00001011 | 100 000 001 010 |

Similarly, Table 7 gives

| | |
|---|---|
| 10111011 | 001000000010 | as the Tmin repetition limiting code, however, further by giving additionally a non duplicate code as the Tmin repetition limiting code, two Tmin repetition limiting codes described herein under may be provided.

| | |
|---|---|
| 10111011 | 001 000 000 010 |
| 11101100 | 001 000 000 101 |

When, Table 7 is changed to the table shown in Table 11 described herein under. In the case of Table 11, the maximum consecutive repetition of the minimum inversion interval Tmin is 6 times.

TABLE 11

RML (1, 7) plus data-bit DSV control
(d, k; m, n; r) = (1, 7; 2, 3; 4)

| data | code |
|---|---|
| 11 | *0* (Before 0* = 1, Before 1: * = 0) |
| 10 | 010 |

TABLE 11-continued

RML (1, 7) plus data-bit DSV control
(d, k; m, n; r) = (1, 7; 2, 3; 4)

| data | code |
|---|---|
| 01 | 001 |
| 0011 | 010 100 |
| 0010 | 000 100 |
| 0001 | 010 000 |
| 000011 | 000 100 100 |
| 000010 | 010 100 100 |
| 00000111 | 000 100 100 100 |
| 00000110 | 000 100 000 010 |
| 00000101 | 000 100 000 001 |
| 00000100 | 000 100 000 101 |
| 00000011 | 010 100 100 100 |
| 00000010 | 010 100 000 010 |
| 00000001 | 010 100 000 001 |
| 00000000 | 010 100 000 101 |
| 10111011 | 001 000 000 010 |
| 11101100 | 001 000 000 101 |

The embodiment shown in FIG. 3 is applied in the same manner as described herein above if the conversion table or inverse conversion table is changed from Table 5 to Table 3, Table 4, and Tables 6 to 11. However, Table 3, Table 4, and Table 8 have no minimum run repetition limiting code, therefore the Tmin repetition limiting code detection unit 33 shown in FIG. 3 is unnecessary. Further in Table 8 and Table 9, indefinite bits are contained in the tables, a process for processing of indefinite bits is necessary.

Another example of Table 5 in which the head and the tail of the code word string is located inversely is realized as shown Table 12.

TABLE 12

RML (1, 7) plus data-bit-DSV control
(d, k; m, n; r) = (1,7; 2, 3; 4)

| data | code |
|---|---|
| 10 | 001 |
| 01 | 010 |
| 1110 | 001 000 |
| 1101 | 010 101 |
| 1111 | 010 100 |
| 1100 | 000 101 |
| 0010 | 010 000 |
| 0001 | 000 100 |
| 001110 | 010 100 100 |
| 001101 | 000 100 101 |
| 001111 | 010 100 101 |
| 001100 | 000 100 100 |
| 000010 | 010 101 000 |
| 000000 | 000 101 000 |
| 00000110 | 010 100 100 100 |
| 00000101 | 000 100 000 010 |
| 00000111 | 010 100 000 010 |
| 00000100 | 000 100 100 100 |
| 00001110 | 010 100 100 101 |
| 00001101 | 000 100 101 000 |
| 00001111 | 010 100 101 000 |
| 00001100 | 000 100 100 101 |
| 11011101 | 000 100 000 001 |

Similarly, another example of Table 9 in which the head and the tail of the code word string is located inversely is realized as shown in Table 13.

TABLE 13

RML (1, 7) plus data-bit-DSV control
(d, k; m, n; r) = (1, 7; 2, 3; 4)

| data | code |
|---|---|
| 11 | *0* |
| 10 | 001 |
| 01 | 010 |
| 0011 | 010 100 |
| 0010 | 000 100 |
| 0001 | 010 000 |
| 000011 | 000 100 100 |
| 000010 | 010 100 100 |
| 00000111 | 000 100 100 100 |
| 00000110 | 010 100 100 100 |
| 00000101 | 000 100 000 001 |
| 00000100 | 010 100 000 001 |
| 00000011 | 000 100 000 010 |
| 00000010 | 010 100 000 010 |
| 00000001 | 000 101 000 010 |
| 00000000 | 001 000 000 010 |
| 01110111(01) | 100101000010 |

In Table 10, with reference to the bit immediately precedent to an indefinite bit, the indefinite bit is prescribed to be 1 if the immediately precedent bit is 1, and on the other hand, the indefinite bit is prescribed to be 0 if the immediately precedent bit is 0.

Within the respective limited length of the data string and code string shown in Table 3 to Table 9, the order of arrangement may be different. For example, the order of arrangement of the limited length i=1 in Table 5 may be as shown herein under.

| | data | code |
|---|---|---|
| i = 1 | 10 | 100 |
| | 01 | 010 | may be

| | data | code |
|---|---|---|
| i = 1 | 10 | 010 |
| | 01 | 100 |

However, the number of "1" of the element of a data string and the number of "1" of the element of a code word string should be prescribed so that residues obtained by dividing the number of "1" of the data string and the number of "1" of the code word string are identically 1 or 0 for both residues.

Next, a simulation result obtained by a process in which consecution of Tmin is limited and the data string having a DSV control bit inserted in the data string is modulated is shown herein under.

The simulation is performed using Table 5 as the conversion table.

DSV control is performed every 47 data bits on a random data of 13107200 bits which is generated arbitrarily using the modulation code table shown in FIG. 5, the data string having the inserted DSV bit is modulated using the table shown in FIG. 5, and when, the Tmin consecutive distribution simulation result is obtained as shown herein under. The maximum Tmin repetition is 7 times, the consecutive repetition of Tmin is effectively shortened. The average inversion interval is calculated by dividing the total channel bit string by the total of the respective T, and in this simulation the value is 3.34T.

```
------ Tmin_length (2T)_ren ------
1: 880259   2: 354047   3: 138230   4: 55922   5: 17056
6: 3717     7: 432      8: 0        9: 0       10: 0
------ average --------
sum: 20079135    total: 6003385
  *****sum/total: 3.3446
```

As for DSV control of this channel bit string, the difference obtained with regarding "1" after NRZI as high and "00" after NRZI as low and the plus side peak of the DSV value and minus side peak value of the DSV are described as herein under. The redundancy percentage in the case that the DSV control bit is inserted every 47 data strings as the DSV bit is 1/(1+47)=2.08% because of 1 data for 47 data strings.

```
------- DC cont -------
high : 10039566    low : 10039569
     total : −3
peak : high_peak-> 33, low_peak-> −34
```

In order to realize DSV control, the DSV control bit is inserted after channel bit string generation because DSV control in the data string is impossible using conventional, for example, RLL (1-7) and RML (1-7). However, in order to perform DSV control with maintaining the maximum run, 4 channel bits are required, the efficiency is poor in comparison with the above-mentioned Table 3 to Table 9.

Further, in the above-mentioned simulation, it is confirmed that the data string obtained by performing a process in which the generated channel bit string is demodulated based on Table 5 and the DSV bit is extracted every 47 bits is identical with the original random data.

As described herein above, according to the present invention, because the variable table has the conversion rule for unique determination and, in detail, the number of repetition of the minimum run length is limited and residues obtained by dividing the number of "1" in the element of the conversion table and the number of "0" in the element of the conversion table by 2 are identically 1 or 0 for both residues, (1) DSV control is performed with reduced redundancy,
(2) the minimum run and the maximum run is maintained in addition to the reduced redundancy, and
(3) error propagation is suppressed because the inserted DSV bit has the same number of bits.

Further in comparison with the code word string in which the repetition of the minimum run is not limited, (4) the allowance to the tangential tilt in high linear density is improved,
(5) the portion where the signal level is low is reduced, the waveform processing accuracy of AGC and PLL is improved, and the total performance is improved, and
(6) short pass memory length design is allowed to be realized for Viterbi decoding more easily in comparison with conventional method, and the circuit scale can be minimized.

As the distribution medium for distributing the computer program for performing the above-mentioned processing to users, recording media such as magnetic disc, CD-ROM, and solid memory and further communication media such as network and satellite may be used.

As described hereinbefore, according to the modulation device described in claim 1, the modulation method described in claim 6, and the distribution medium described in claim 7, because the element in the conversion table is composed of the element which is determined uniquely, and has the conversion rule that residues obtained by dividing the number of "1" in the element of a data string and the number of "1" in the element of a code word string to be converted by 2 are identically 1 or 0 for both residues, DSV control is performed in the data string, DSV control is performed with reduced redundancy, and the maximum run k is at least 7.

As described hereinbefore, according to the modulation device described in claim 8, the modulation method described in claim 14, and the distribution medium described in claim 15, because the conversion table has the indefinite code and has the conversion rule that residues obtained by dividing the number of "1" in the element of a data string and the number of "1" in the element of a code word string to be converted by 2 are identically 1 or 0 for both residues, DSV control is performed in the data string, DSV control is performed with reduced redundancy, and the maximum run k is at least 7. Further, because the consecution of the minimum run is limited without extending the limited length of the conversion table, it becomes possible to perform stably clock reproduction with reduced incremental error propagation length.

According to the modulation device described in claim 16, the modulation method described in claim 20, and distribution medium described in claim 21, because the conversion table has the code for limiting consecution of the minimum run and has the conversion rule that residues obtained by dividing the number of "1" in the element of a data string and the number of "1" in the element of a code word string to be converted by 2 are identically 1 or 0 for both residues, DSV control is performed in the data string, DSV control is performed with reduced redundancy, and the maximum run k is at least 7.

What is claimed is:

1. A modulation device comprising modulation means for converting a data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:
   the conversion table of said modulation means has the minimum run d of 1;
   has a variable length structure;
   has elements which are determined uniquely; and
   has a conversion rule that residues obtained by dividing the number of "1" in the element of a data string and the number of "1" in the element of a code word string to be converted by 2 are identically 1 or 0 for both residues.

2. A modulation device as claimed in claim 1, wherein said conversion table prescribes that the maximum run k is at least 7.

3. A modulation device as claimed in claim 2, wherein said conversion table prescribes that the limited length is at least 4 when the maximum run k is 7.

4. A modulation device as claimed in claim 1, further comprising DSV control means for controlling DSV of input data and supplying DSV to said modulation means.

5. A modulation device as claimed in claim 1, wherein said conversion table has a code for limiting consecution of the minimum run.

6. A modulation method for converting data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:
   said conversion table has the minimum run d of 1;
   has a variable length structure;
   has elements which are determined uniquely; and
   said conversion of data is performed in accordance with the steps of:
   determining a first residue by dividing the number of "1" in the element of a data string by 2;
   determining a second residue by dividing the number of "1" in the element of a code word string to be converted by 2; and
   converting said data if said first residue and said second residue are identically "1" or "0".

7. A distribution medium for providing a computer program which converts data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:
   said conversion table has the minimum run d of 1;
   has a variable length structure;
   has elements which are determined uniquely; and
   has a conversion rule that residues obtained by dividing the number of "1" in the element of a data string and the number of "1" in the element of a code word string to be converted by 2 are identically 1 or 0 for both residues.

8. A modulation device comprising modulation means for converting data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:
   said conversion table of the modulation means has the minimum run d of 1;
   has a variable length structure;
   has elements having an indefinite code; and
   has a conversion rule that residues obtained by dividing the number of "1" in the element of a data string and the number of "1" in the element of a code word string to be converted by 2 are identically 1 or 0 for both residues.

9. A modulation device as claimed in claim 8, wherein an indefinite bit which is the component of the indefinite code is prescribed to be "1" if 0 continues consecutively d bits or more precedent or subsequent to an indefinite bit and prescribed to be "0" otherwise.

10. A modulation device as claimed in claim 9, wherein said conversion table has two said indefinite bits in an identical conversion element.

11. A modulation device as claimed in claim 10, wherein the maximum run k is at least 7 in said conversion table.

12. A modulation device as claimed in claim 11, wherein in said conversion table, the limited length is at least 4 when the maximum run k is 7.

13. A modulation device as claimed in claim 8, wherein said conversion table has a code for limiting consecution of the minimum run.

14. A modulation method for converting data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:

said conversion table has the minimum run d of 1;

has a variable length structure;

has elements having an indefinite code; and said conversion of data is performed in accordance with the steps of:

determining a first residue by dividing the number of "1" in the element of a data string by 2;

determining a second residue by dividing the number of "1" in the element of a code word string to be converted by 2; and converting said data if said first residue and said second residue are identically "1" or "0".

15. A distribution medium for providing a computer program which converts data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:

the conversion table has the minimum run d of 1;

has a variable length structure;

has elements having an indefinite code; and has a conversion rule that residues obtained by dividing the number of "1" in the element of a data string and the number of "1" in the element of a code word string to be converted by 2 are identically 1 or 0 for both residues.

16. A modulation device comprising modulation means for converting data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:

said conversion table of the modulation means has the minimum run d of 1;

has a variable length structure;

has a code for limiting consecution of the minimum run; and has a conversion rule that residues obtained by dividing the number of "1" in the element of a data string and the number of "1" in the element of a code word string to be converted by 2 are identically 1 or 0 for both residues.

17. A modulation device as claimed in claim 16, wherein the maximum run k is at least 7 in said conversion table.

18. A modulation device as claimed in claim 16, wherein in said conversion table, the limited length is at least 4 when the maximum run k is 7.

19. A modulation device as claimed in claim 16, further comprising DSV control means for controlling DSV of input data and supplying the DSV to said modulation means.

20. A modulation method for converting data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:

said conversion table has the minimum run d of 1;

has a variable length structure;

has a code for limiting consecution of the minimum run; and said conversion of data is performed in accordance with the steps of:

determining a first residue by dividing the number of "1" in the element of a data string by 2;

determining a second residue by dividing the number of "1" in the element of a code word string to be converted by 2; and converting said data if said first residue and said second residue are identically "1" or "0".

21. A distribution medium for providing a computer program which converts data having a base data length of m bits to a variable length code having a base code length of n bits (d, k; m, n; r) based on a conversion table, wherein d is the minimum consecutive number of "0" inserted between consecutive "1", k is the maximum consecutive number of "0" inserted between consecutive "1", and r is the maximum limited length, and wherein:

said conversion table has the minimum run d of 1;

has a variable length structure;

has a code for limiting consecution of the minimum run; and has a conversion rule that residues obtained by dividing the number of "1" in the element of a data string and the number of "1" in the element of a code word string to be converted by 2 are identically 1 or 0 for both residues.

* * * * *